United States Patent
Basker et al.

(10) Patent No.: US 10,916,660 B2
(45) Date of Patent: Feb. 9, 2021

(54) VERTICAL TRANSISTOR WITH A BODY CONTACT FOR BACK-BIASING

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 27 days.

(21) Appl. No.: 16/034,828

(22) Filed: Jul. 13, 2018

(65) Prior Publication Data
US 2018/0337059 A1    Nov. 22, 2018

Related U.S. Application Data

(63) Continuation of application No. 15/483,125, filed on Apr. 10, 2017, now Pat. No. 10,096,484, which is a (Continued)

(51) Int. Cl.
*H01L 29/786* (2006.01)
*H01L 29/66* (2006.01)
(Continued)

(52) U.S. Cl.
CPC .. *H01L 29/78648* (2013.01); *H01L 21/28008* (2013.01); *H01L 21/3085* (2013.01);
(Continued)

(58) Field of Classification Search
None
See application file for complete search history.

(56) References Cited

U.S. PATENT DOCUMENTS

| 4,833,517 A | 5/1989 | Heiblum et al. |
| 5,128,272 A | 7/1992 | Ramde |

(Continued)

FOREIGN PATENT DOCUMENTS

WO    2005091376 A1    9/2005

OTHER PUBLICATIONS

List of IBM Patents or Patent Applications Treated as Related; (Appendix P), Filed Jul. 13, 2018, 2 pages.

*Primary Examiner* — Anthony Ho
*Assistant Examiner* — Kevin Quinto
(74) *Attorney, Agent, or Firm* — Cantor Colburn LLP; Robert Sullivan

(57) ABSTRACT

A method of forming a substrate contact in a vertical transistor device includes patterning a sacrificial layer to form an opening in the sacrificial layer, the sacrificial layer disposed on hardmask arranged on a substrate, and the substrate including a bulk semiconductor layer, a buried oxide layer arranged on the bulk semiconductor layer, and a semiconductor layer arranged on the buried oxide layer; forming oxide spacers on sidewalls of the opening in the sacrificial layer; using the oxide spacers as a pattern to etch a trench through the substrate, the trench stopping at a region within the bulk semiconductor layer; and depositing a conductive material in the trench to form the substrate contact.

18 Claims, 11 Drawing Sheets

Related U.S. Application Data continuation of application No. 15/149,421, filed on May 9, 2016, now Pat. No. 9,653,575.

(51) Int. Cl.

| | |
|---|---|
| *H01L 29/78* | (2006.01) |
| *H01L 29/423* | (2006.01) |
| *H01L 27/12* | (2006.01) |
| *H01L 29/10* | (2006.01) |
| *H01L 29/08* | (2006.01) |
| *H01L 21/28* | (2006.01) |
| *H01L 21/306* | (2006.01) |
| *H01L 21/308* | (2006.01) |
| *H01L 21/768* | (2006.01) |
| *H01L 23/535* | (2006.01) |
| *H01L 29/06* | (2006.01) |
| *H01L 29/417* | (2006.01) |

(52) U.S. Cl.
CPC .. *H01L 21/30604* (2013.01); *H01L 21/76895* (2013.01); *H01L 23/535* (2013.01); *H01L 27/1207* (2013.01); *H01L 29/0649* (2013.01); *H01L 29/0847* (2013.01); *H01L 29/1037* (2013.01); *H01L 29/41741* (2013.01); *H01L 29/4236* (2013.01); *H01L 29/42392* (2013.01); *H01L 29/66553* (2013.01); *H01L 29/66666* (2013.01); *H01L 29/66772* (2013.01); *H01L 29/783* (2013.01); *H01L 29/7827* (2013.01); *H01L 29/78615* (2013.01); *H01L 29/78618* (2013.01); *H01L 29/78642* (2013.01)

(56) References Cited

U.S. PATENT DOCUMENTS

| | | | |
|---|---|---|---|
| 5,326,711 | A | 7/1994 | Malhi |
| 5,365,097 | A | 11/1994 | Kenney |
| 5,641,694 | A | 6/1997 | Kenney |
| 6,104,061 | A | 8/2000 | Forbes et al. |
| 6,150,210 | A | 11/2000 | Arnold |
| 6,194,773 | B1 | 2/2001 | Malhi |
| 6,320,225 | B1 * | 11/2001 | Hargrove ............ H01L 27/1203 257/347 |
| 6,358,827 | B1 * | 3/2002 | Chen ................ H01L 21/28114 257/E21.205 |
| 6,518,616 | B2 | 2/2003 | Dyer et al. |
| 7,560,728 | B2 | 7/2009 | Lin et al. |
| 7,791,068 | B2 | 9/2010 | Meng et al. |
| 8,383,477 | B2 | 2/2013 | Lee |
| 8,471,310 | B2 | 6/2013 | Hynecek |
| 9,048,329 | B2 | 6/2015 | Kim et al. |
| 9,076,686 | B1 | 7/2015 | Karda et al. |
| 9,099,384 | B2 | 8/2015 | May et al. |
| 9,190,505 | B2 | 11/2015 | Hirai et al. |
| 9,324,846 | B1 * | 4/2016 | Camillo-Castillo ........................ H01L 29/7371 |
| 9,653,575 | B1 | 5/2017 | Basker et al. |
| 2002/0030229 | A1 * | 3/2002 | Christensen .......... H01L 21/266 257/347 |
| 2003/0015755 | A1 | 1/2003 | Hagemeyer |
| 2008/0197397 | A1 | 8/2008 | Parthasarathy et al. |
| 2011/0006360 | A1 | 1/2011 | Ikebuchi |
| 2012/0214285 | A1 | 8/2012 | Guha et al. |
| 2014/0134950 | A1 | 5/2014 | Leedy |
| 2015/0200202 | A1 | 7/2015 | Karda et al. |
| 2017/0323948 | A1 | 11/2017 | Basker et al. |

\* cited by examiner

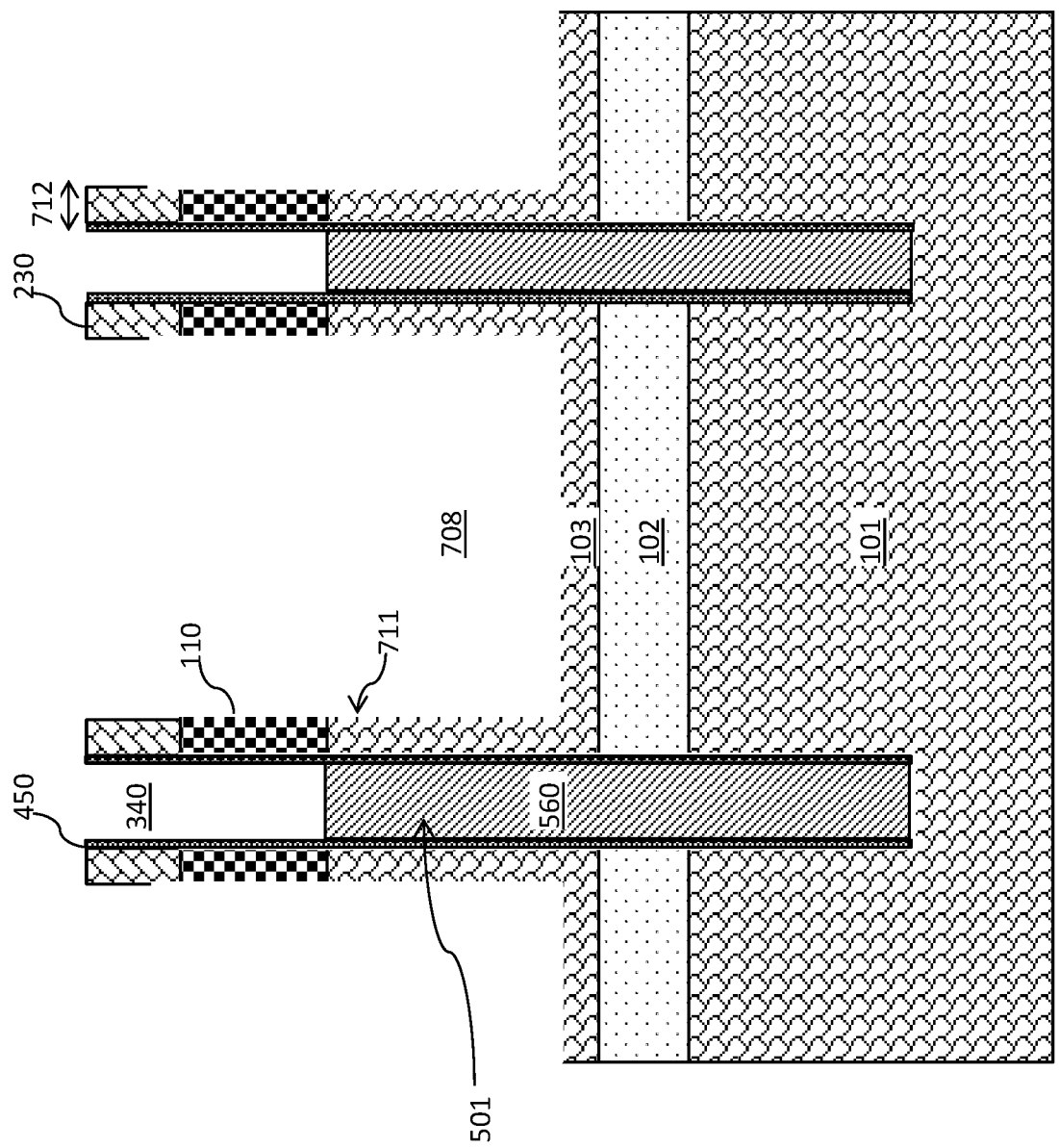
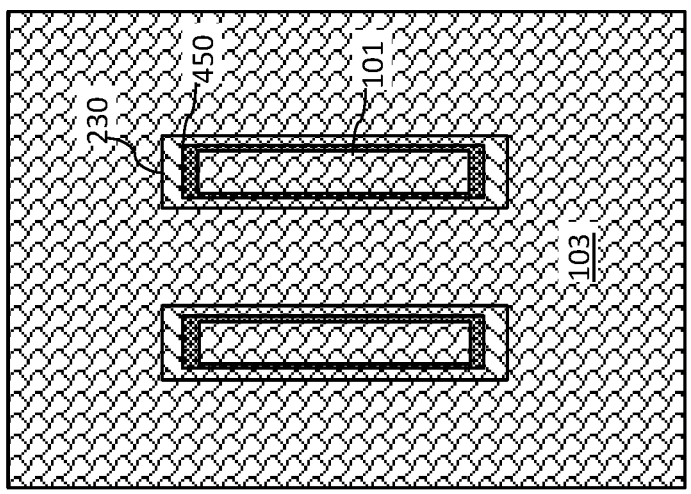
FIG. 7A
FIG. 7B

VERTICAL TRANSISTOR WITH A BODY CONTACT FOR BACK-BIASING

PRIORITY

This application is a continuation of and claims priority from U.S. patent application Ser. No. 15/483,125, filed on Apr. 10, 2017, which is a continuation of and claims priority from U.S. patent application Ser. No. 15/149,421, filed on May 9, 2016, entire contents of both applications are incorporated herein by reference.

BACKGROUND

The present invention relates to complementary metal oxide semiconductor (CMOS) technology, and more specifically, to vertical transistor semiconductor devices.

CMOS is used for constructing integrated circuits. CMOS technology is used in microprocessors, microcontrollers, static random access memory (RAM) and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions. Vertical transistors thus may provide higher density scaling that alleviate middle-of-line (MOL) fabrication complexity.

SUMMARY

According to an embodiment, a method of forming a substrate contact in a vertical transistor device includes patterning a sacrificial layer to form an opening in the sacrificial layer, the sacrificial layer disposed on hardmask arranged on a substrate, and the substrate including a bulk semiconductor layer, a buried oxide layer arranged on the bulk semiconductor layer, and a semiconductor layer arranged on the buried oxide layer; forming oxide spacers on sidewalls of the opening in the sacrificial layer; using the oxide spacers as a pattern to etch a trench through the substrate, the trench stopping at a region within the bulk semiconductor layer; and depositing a conductive material in the trench to form the substrate contact.

According to another embodiment, a vertical transistor device with a substrate contact includes a substrate including a bulk semiconductor layer, a buried oxide layer arranged on the bulk semiconductor layer, and a semiconductor layer arranged on the buried oxide layer, a portion of the semiconductor layer forming a bottom source/drain; a channel formed by the semiconductor layer and extending from the bottom source/drain to a top source/drain; a gate stack arranged in a trench within the semiconductor layer and between a first spacer and a second spacer, the second spacer arranged on the gate stack; and a contact including a conductive material extending from a region within the bulk semiconductor layer, through the buried oxide layer, along a sidewall of the the channel, and to the second spacer.

Yet, according to another embodiment, a vertical transistor device with a substrate contact includes a substrate including a bulk semiconductor layer, a buried oxide layer arranged on the bulk semiconductor layer, and a semiconductor layer arranged on the buried oxide layer, a portion of the semiconductor layer forming a bottom source/drain; a first channel portion formed by the semiconductor layer and extending from the bottom source/drain to a first epitaxial growth forming a first top source/drain portion; a second channel portion formed by the semiconductor layer and extending from the bottom source/drain to a second epitaxial growth forming a second top source/drain portion; a gate stack arranged in a trench within the semiconductor layer and between a first spacer layer and a second spacer layer; and a contact extending from a region within the bulk semiconductor layer, through the buried oxide layer, along a sidewall of the the channel, and to the second spacer layer.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-11 illustrate exemplary methods of making vertical transistors according to embodiments, in which:

FIGS. 1A and 1B are a top view and a cross-sectional side view, respectively, of a patterned sacrificial layer arranged on a hardmask disposed on a substrate;

FIGS. 7A and 7B are a top view and a cross-sectional side view, respectively, after etching the substrate to form gate trenches and vertical channels;

FIG. 8 is a cross-sectional side view after depositing gate spacers and a gate stack in the gate trenches;

FIG. 9 is a cross-sectional side view after removing the hardmask;

FIG. 10 is a cross-sectional side view after forming epitaxial growth on the to form the top source/drain; and FIG. 11 is a cross-sectional side view after forming a gate contact and top source/drain contacts.

DETAILED DESCRIPTION

Although vertical transistors may be used for smaller device scaling, one challenge that may arise in vertical transistors is the ability to provide multi-threshold voltages (multi-Vt). The Vt necessary depends on the device application. For example, high-performance devices need a low Vt. However, mobile or stand-by devices need high Vt for lower leakage control. One way to provide the multi-Vt property is to use different work-function metals, different gate lengths, and channel doping. As described below, a multi-Vt device is achieved by providing a device structure in which a back bias voltage can be applied for Vt adjustment.

Accordingly, various embodiments provide devices and methods of making vertical transistor devices with a contact (e.g., a body contact or a substrate contact) that extends from a region within the channel to the substrate (see FIG. 11) in some embodiments. The body contact formed includes a conductive material, such as a metal or doped polysilicon (see FIGS. 5A and 5B). The body contact allows a back bias voltage to be applied to the channel for multiple threshold (Vt) voltage control.

Back-biasing, which includes applying a voltage just under the buried oxide (BOX) layer of the substrate, provides several advantages. Applying the voltage in this region changes the electrostatic control of the transistor and shifts the threshold voltage (Vt). Shifting the threshold voltage (Vt) may provide more drive current, hence higher performance, at the expense of increased leakage current (forward back-bias). Shifting the threshold voltage (Vt) may also cut leakage current at the expense of reduced performance.

Figure 1B:
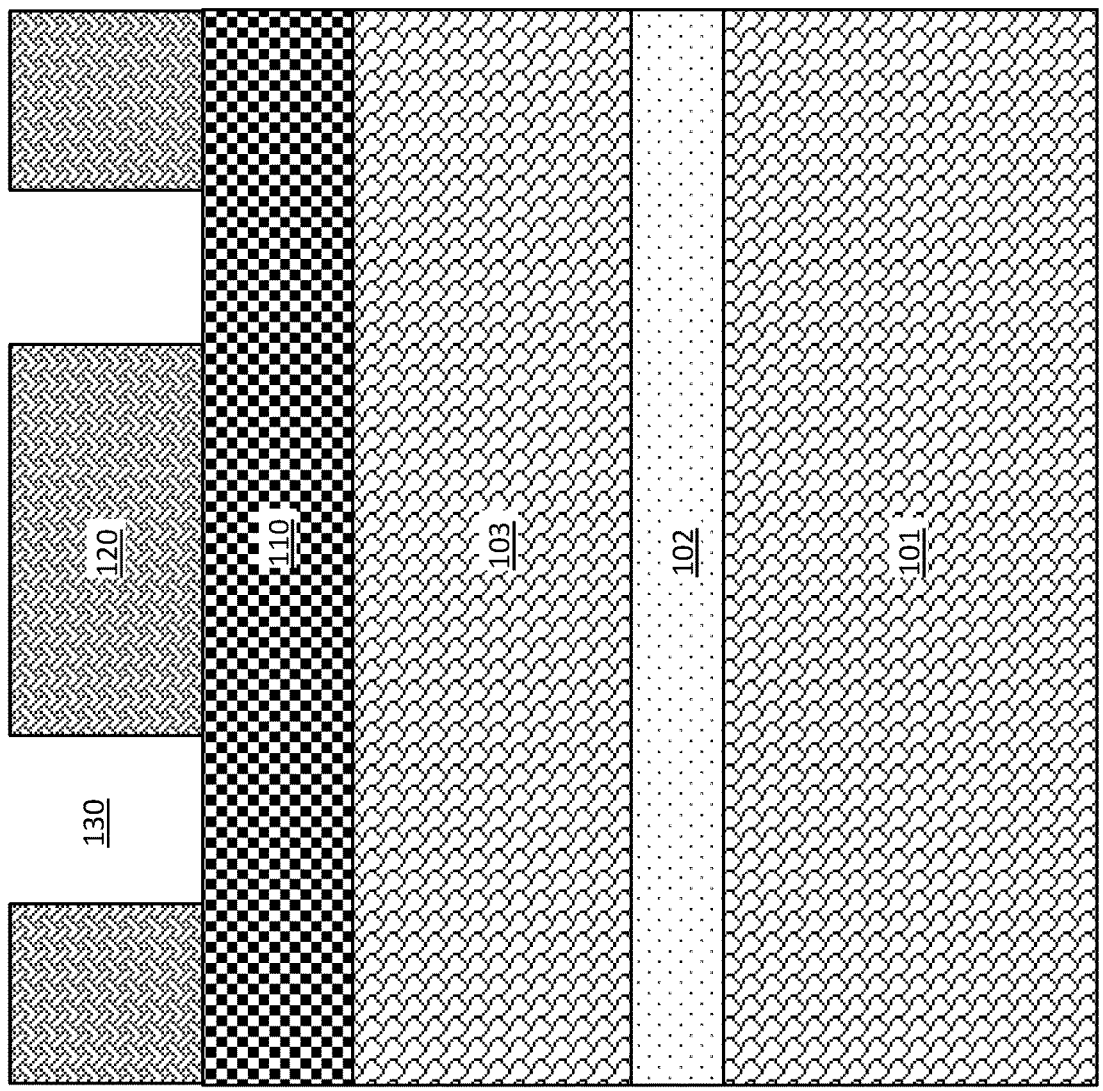
Figure 1A:
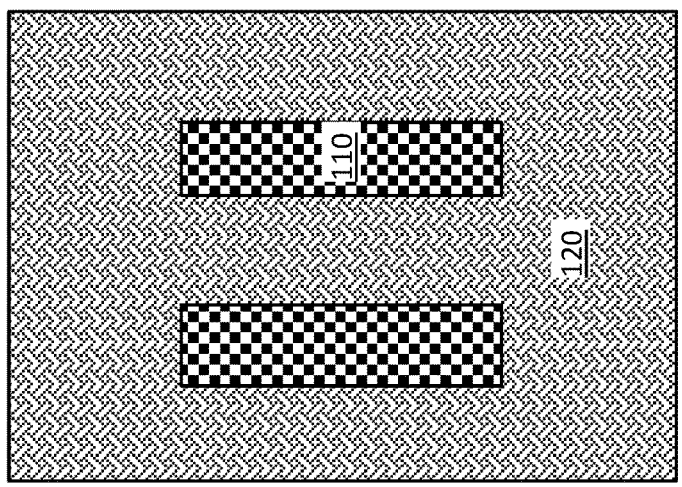

Turning now to the Figures, FIGS. 1A-11 illustrate exemplary methods of making vertical transistors according to embodiments. FIGS. 1A and 1B are a top view and a cross-sectional side view, respectively, of patterned sacrificial layer 120 arranged on a hardmask 110 disposed on a substrate. The substrate includes a bulk semiconductor substrate 101, a buried oxide layer 102 arranged on the bulk semiconductor layer 101, and a semiconductor layer 103 arranged on the buried oxide layer 102.

The bulk semiconductor substrate 101 includes one or more semiconductor materials. Non-limiting examples of suitable bulk semiconductor substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

The composition of the buried oxide layer 102 depends on the composition of the bulk semiconductor substrate 101. In one example, the bulk semiconductor substrate 101 includes silicon, and the buried oxide layer 102 includes silicon dioxide ($SiO_2$). In another example, the bulk semiconductor substrate 101 includes germanium, and the buried oxide layer 102 includes germanium dioxide ($GeO_2$). In a further example, the bulk semiconductor substrate 101 includes GaAs, and the buried oxide layer 102 includes $Ga_2O_3$, $As_2O_3$, $As_2O_5$, or any combination thereof.

Another semiconductor layer 103 is arranged on the buried oxide layer 102. At least a portion of the semiconductor layer 103 may be doped with a dopant to form a doped source/drain layer (bottom source/drain). The dopant may be a p-type dopant or an n-type dopant, depending on the type of transistor. In other embodiments, the semiconductor layer 103 may be implanted with a dopant to form the source/drain (bottom source/drain).

A hardmask layer 110 is arranged on the semiconductor layer 103 of the substrate. The hardmask layer 110 may include, but is not limited to, silicon oxide, silicon nitride, or any combination thereof.

A sacrificial layer 120 is deposited on the hardmask layer 110. The sacrificial layer 120 may be, for example, amorphous carbon (a-C). The sacrificial layer 120 is deposited by a suitable deposition process, for example, chemical vapor deposition (CVD), or other suitable process. The sacrificial layer 120 is patterned using lithography and etching to form at least one opening 130 through the sacrificial layer 120.

Figure 2B:
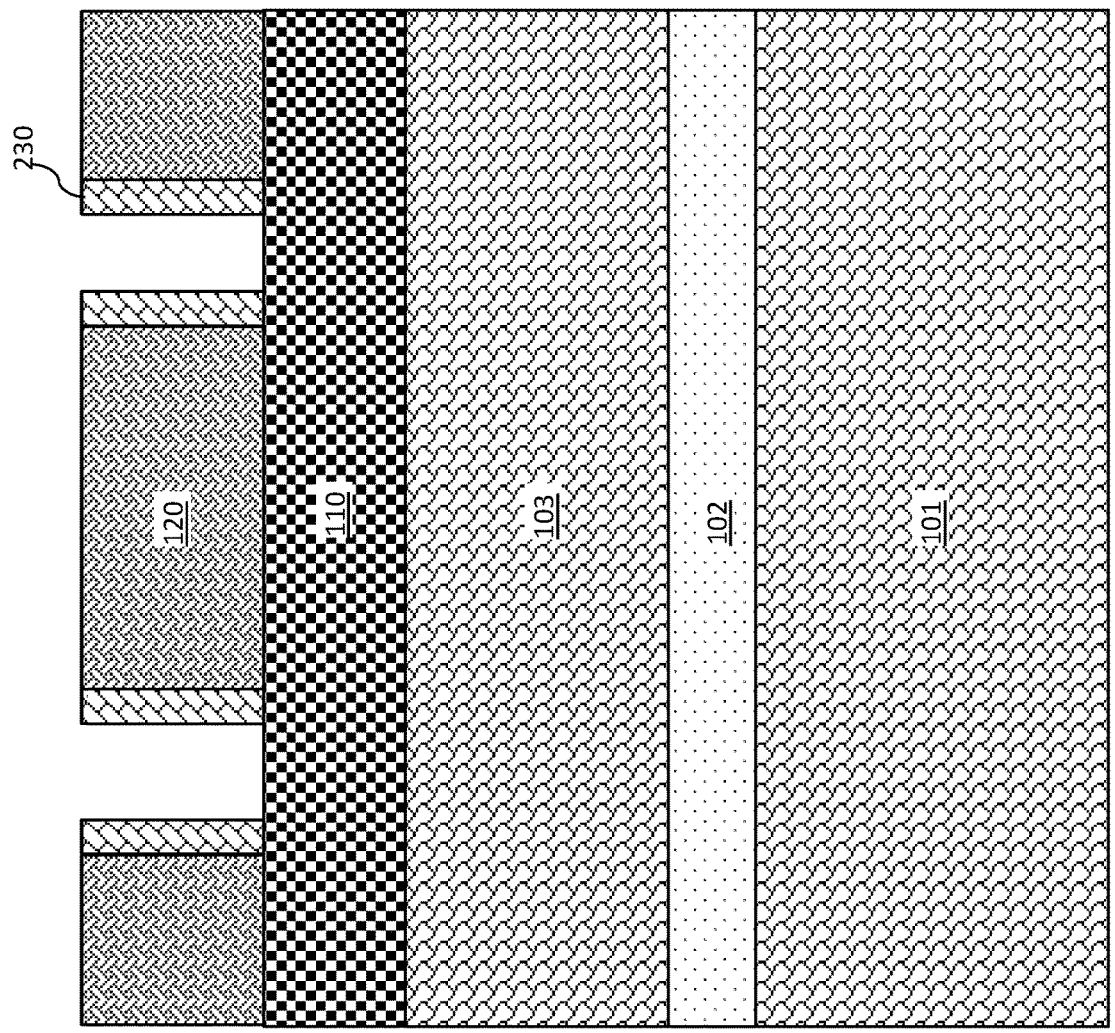
FIGS. 2A and 2B are a top view and a cross-sectional side view, respectively, after depositing an oxide spacer on the patterned sacrificial layer.
Figure 2A:
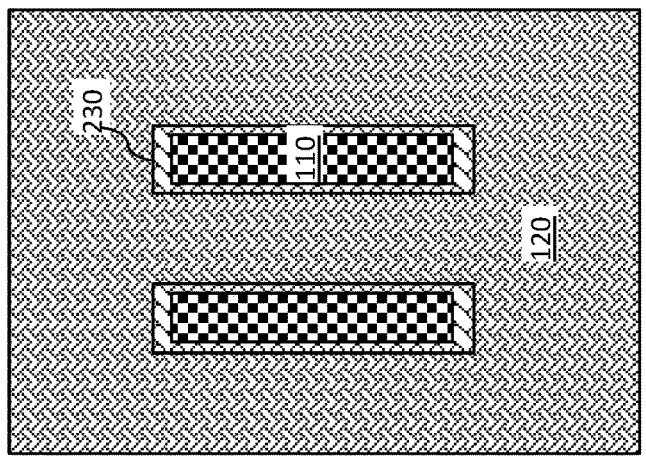

FIGS. 2A and 2B are a top view and a cross-sectional side view, respectively, after depositing an oxide spacer 230 on the patterned sacrificial layer 120. The oxide spacer 230 is deposited as an oxide layer on the patterned sacrificial layer 120. The oxide layer is then etched back to remove excess oxide from the surface of the sacrificial layer 120 and from the hardmask layer 110. The etch process may be, for example, a wet/dry etch process. The oxide layer remains on sidewalls of the opening 130 to form the oxide spacers 230.

Non-limiting examples of oxides for the oxide spacers 230 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 3B:
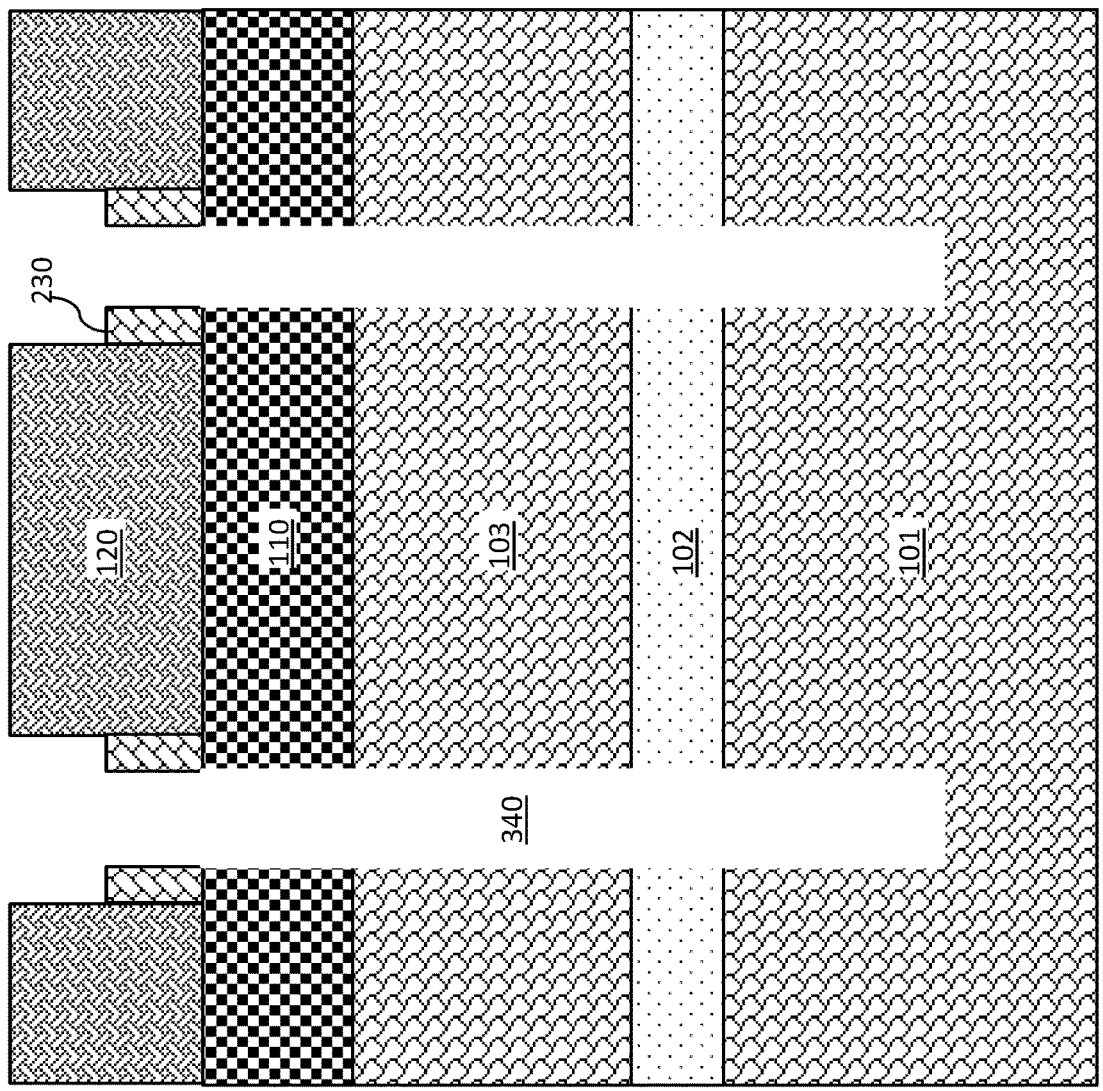
FIGS. 3A and 3B are a top view and a cross-sectional side view, respectively, after a forming a trench through the hardmask and the substrate.
Figure 3A:
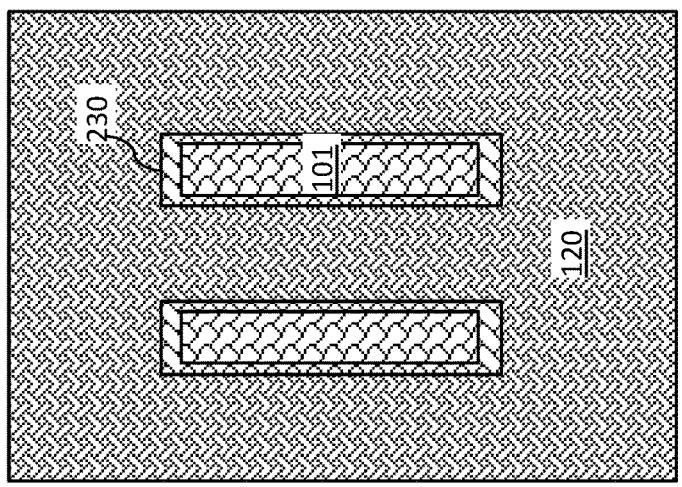

FIGS. 3A and 3B are a top view and a cross-sectional side view, respectively, after a forming a trench 340 (substrate contact trench) through the hardmask layer 110, the semiconductor layer 103, and the buried oxide layer 102, stopping within the bulk semiconductor substrate 101. The oxide spacers 230 provide a guide pattern for etching the trench 340. The etch process performed may partially recess the oxide spacers 230. One or more etch processes may be performed. The etch processes may be, for example, a dry etch processes, such as a SiN process and/or a Si RIE process.

Figure 4B:
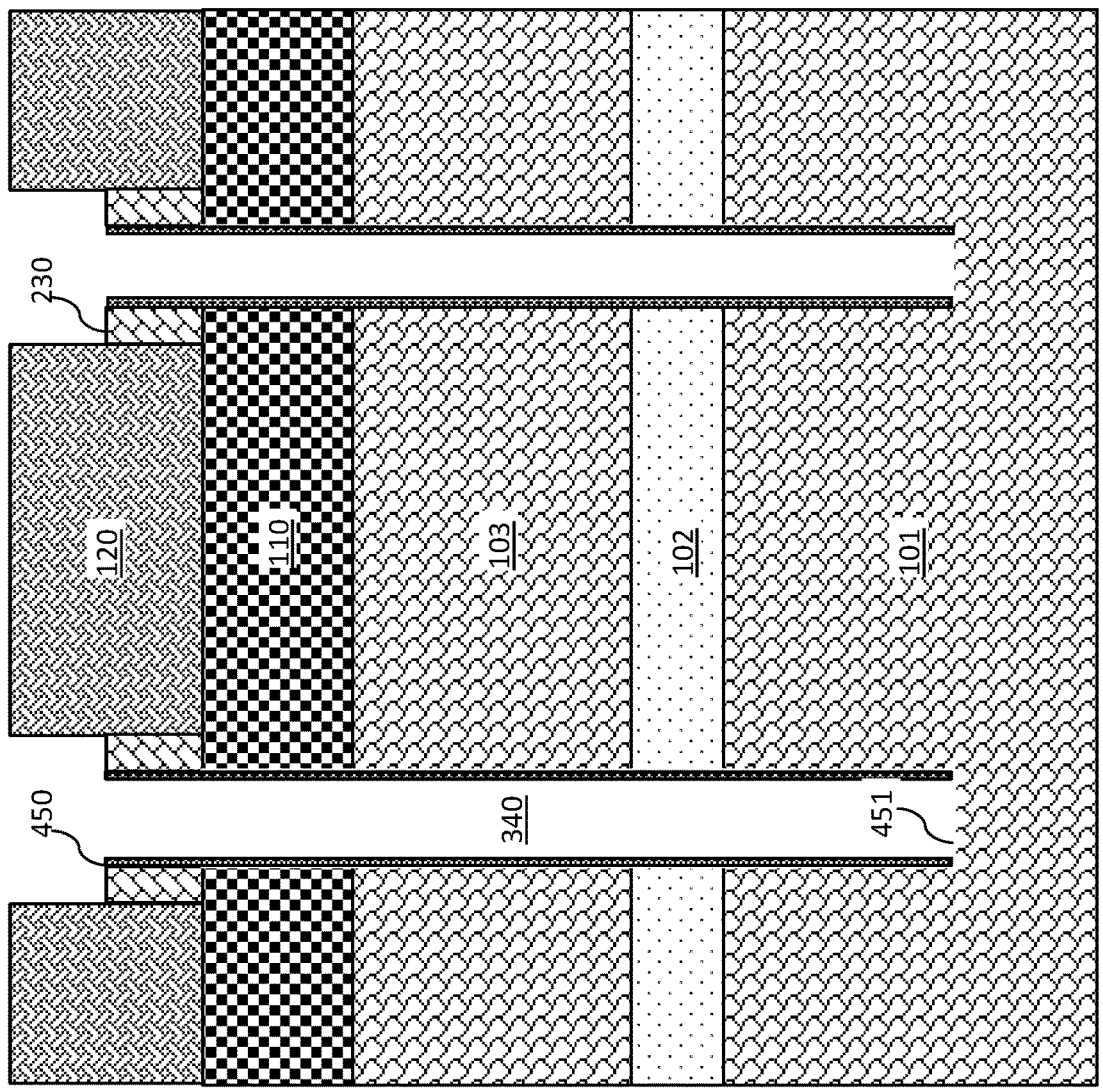
FIGS. 4A and 4B are a top view and a cross-sectional side view, respectively, after depositing a liner in the trench.
Figure 4A:
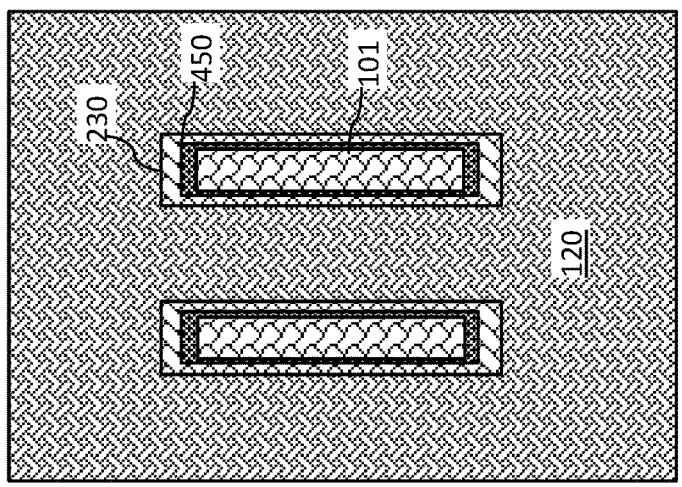

FIGS. 4A and 4B are a top view and a cross-sectional side view, respectively, after depositing a liner 451 in the trench 340. The liner 451 may include, for example, an oxide material. In one embodiment, the liner 451 may be a nitride material, such as silicon nitride. The liner 451 is deposited as a blanket oxide layer that lines sidewalls of the trench 340. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. After depositing the oxide layer, the oxide material is etched back to remove material from the bottom surface 451 of the trench 340 (the endwall of the trench 340), only leaving the liner deposited on sidewalls of the trench 340. The oxide material is also removed from the surface of the sacrificial layer 120.

Figure 5B:
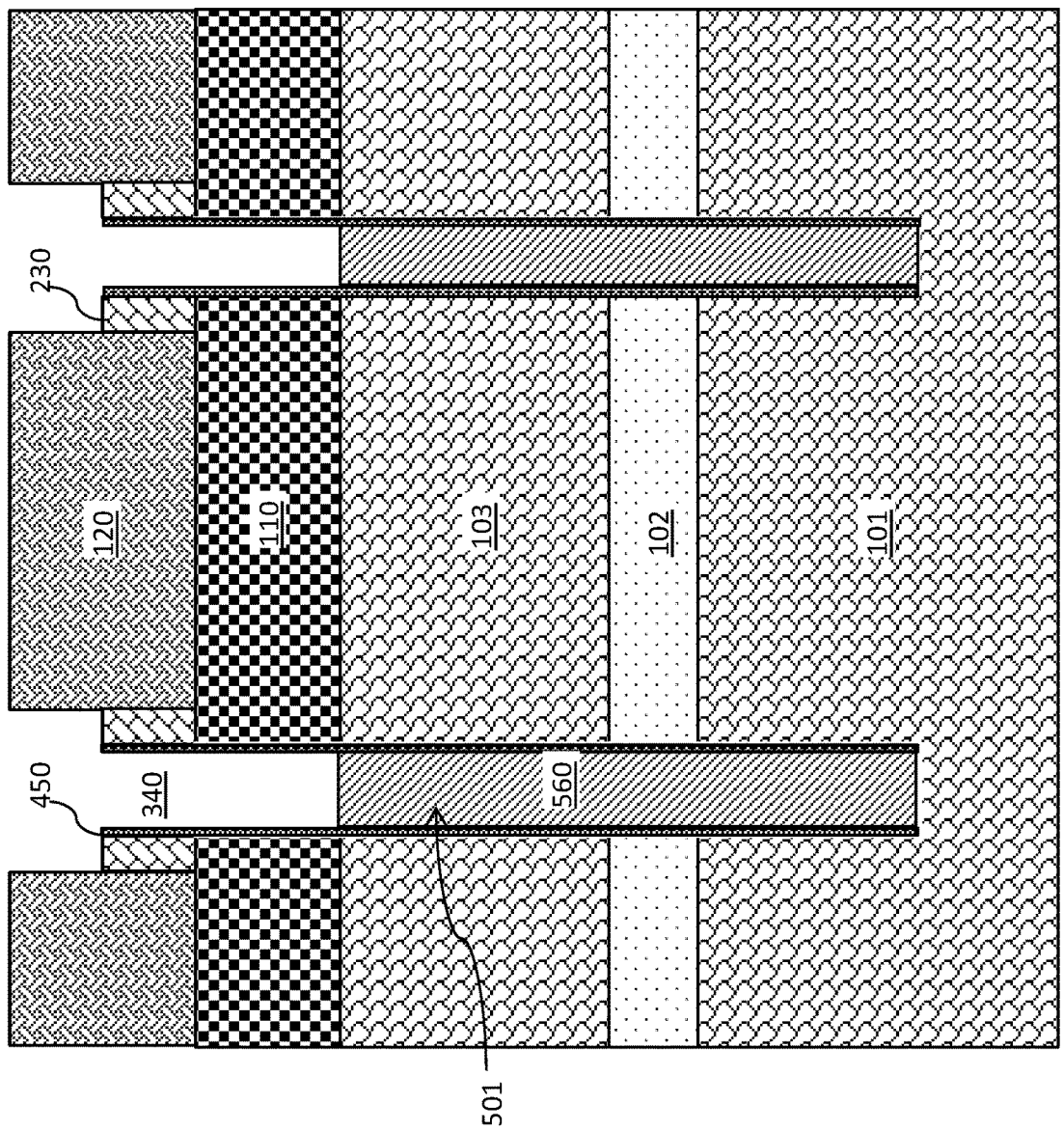
FIGS. 5A and 5B are a top view and a cross-sectional side view, respectively, after filling the trench with a conductive material.
Figure 5A:
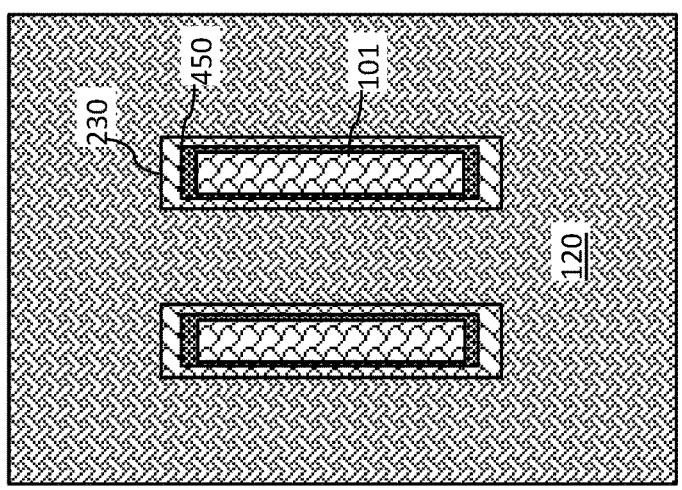

FIGS. 5A and 5B are a top view and a cross-sectional side view, respectively, after filling the trench 340 with a conductive material 560. The conductive material 560 may be, for example, a metal or doped polysilicon (poly-Si). Non-limiting examples of metals include aluminum (Al), platinum (Pt), gold (Au), tungsten (W), titanium (Ti), or any combination thereof. The metal may be deposited by a suitable deposition process, for example, chemical vapor deposition (CVD), plasma enhanced chemical vapor deposition (PECVD), physical vapor deposition (PVD), plating, thermal or e-beam evaporation, or sputtering. The polysilicon may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The polysilicon is doped with a dopant. The dopant is the same type as the source/drain of semiconductor layer 103. The dopant may be a p-type dopant, for example boron, or an n-type dopant, for example phosphorus or arsenic.

The conductive material 560 is planarized and etched back to from the body contact 501 (substrate contact) to the substrate 101. The planarization may be, for example, chemical mechanical planarization (CMP). The planarization removes excess conductive material 560 from surfaces of the sacrificial layer 120 and the oxide spacers 230. The conductive material 560 is etched back (recessed) such that the conductive material is at a level at or below the hardmask layer 110. A planarization process, for example, CMP, is performed to remove any conductive material from the surface of the sacrificial layer 120.

The conductive material 560 forms a contact 501 that extends through the substrate 101, the buried oxide layer 102, and the semiconductor layer 103. The contact 501 stops at the level of the hardmask layer 110. The contact 501 is lined by the liner layer 450 along the sidewalls. The conductive material 560 forming the substrate contact is arranged directly on the bulk semiconductor substrate 101.

Figure 6B:
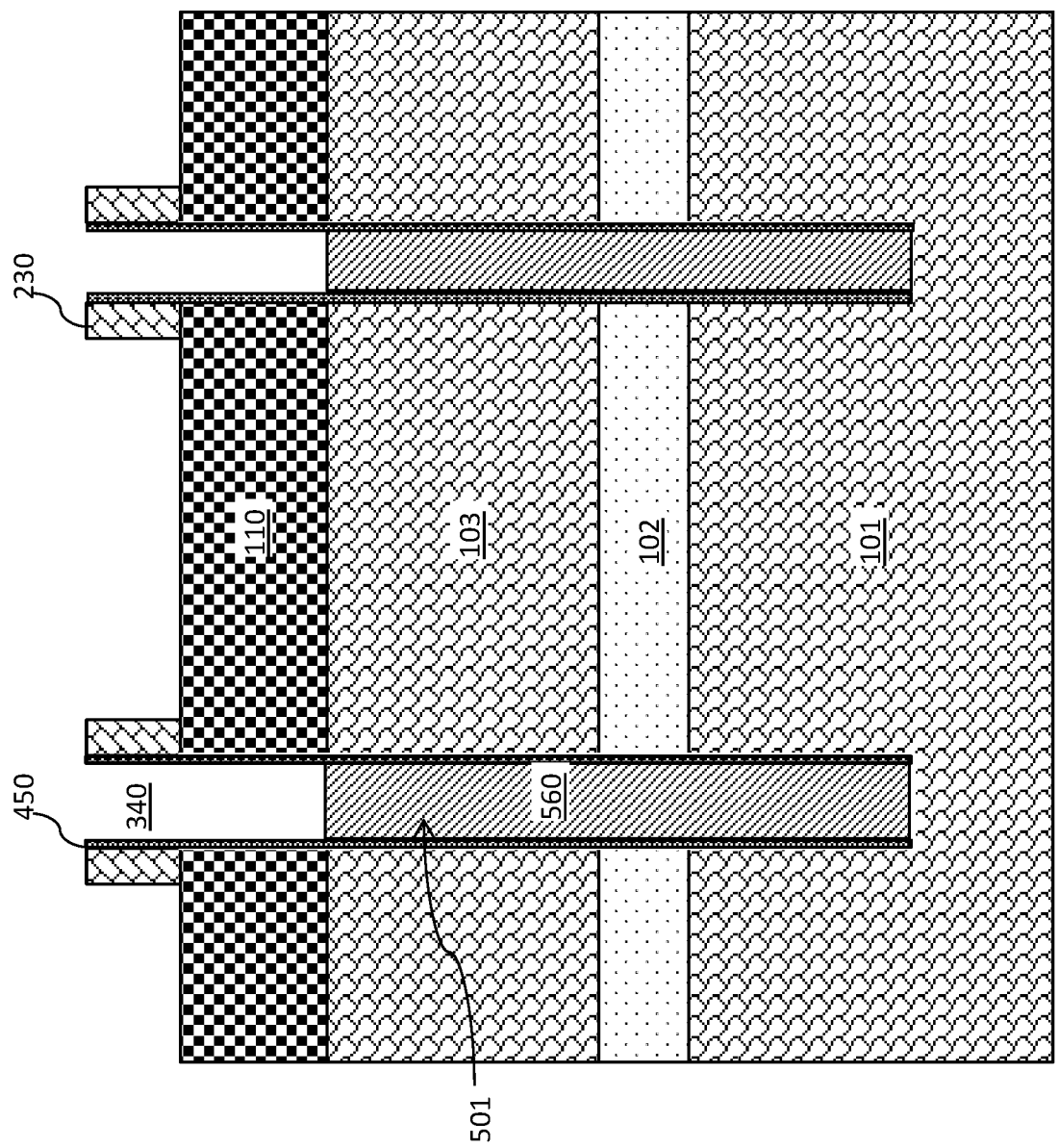
FIGS. 6A and 6B are a top view and a cross-sectional side view, respectively, after removing the patterned sacrificial layer.
Figure 6A:
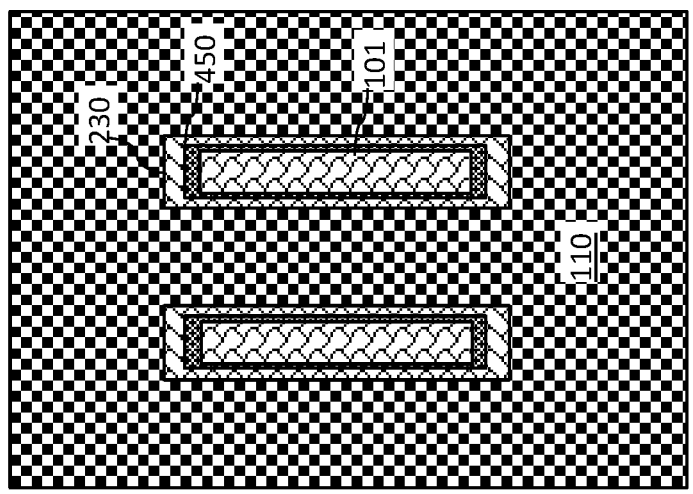

FIGS. 6A and 6B are a top view and a cross-sectional side view, respectively, after removing remaining portions of the sacrificial layer 120. Portions of the hardmask layer 110 are exposed, and the oxide spacers 230 protrude from the surface of the hardmask layer 110 and the trench 340. The sacrificial layer 120 may be removed by, for example, ashing. Ashing is performed using a suitable reaction gas, for example, $O_2$, $N_2$, $H_2/N_2$, $O_3$, $CF_4$, or any combination thereof.

FIGS. 7A and 7B are a top view and a cross-sectional side view, respectively, after etching the substrate to form gate trenches 708. The gate trenches 708 are formed in the semiconductor layer 103 and stop in a region above the buried oxide layer 102. Some of the semiconductor layer 103 is left arranged on the buried oxide layer 102. The gate trenches 708 are formed by removing a portion of the semiconductor layer 103 by, for example, etching. The etch process may be an anisotropic etch process, for example, a reactive ion etch (RIE) that includes $CF_4$, $SF_6$, and/or $NF_3$.

Vertical channels 711 are formed along sidewalls of the contact 560. The pair of vertical channels 711 (first vertical channel portion and second vertical channel portion) are arranged adjacent to the substrate contact 560. The widths of the vertical channels 711 are defined by the oxide spacers 230, which provide a patterning mask for forming the channels. The vertical channels 711 have a width 712 that may generally vary and is not intended to be limited. In some embodiments, the vertical channels 711 have a width 712 in a range from about 3 to about 20 nanometers (nm), or from about 4 to about 15 nm.

The vertical channels 711 are formed from the semiconductor layer 103 and extend from the portion of the semiconductor layer 103 forming the bottom source/drain to the remaining portions of the hardmask layer 110.

Figure 8:
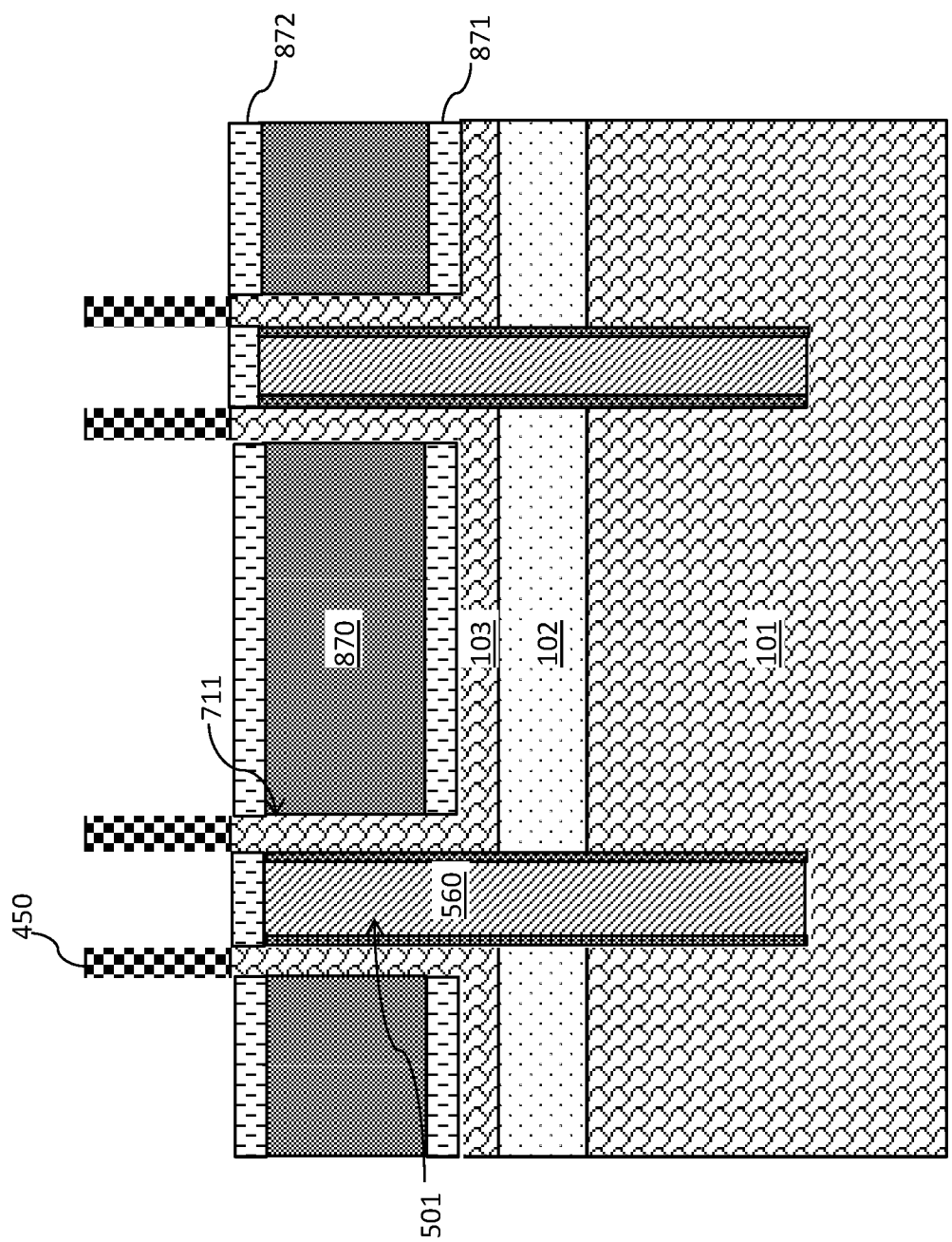

FIG. 8 is a cross-sectional side view after depositing spacers 871, 872 and a gate stack 870 in the gate trenches 708. The first spacer 871 (bottom spacer) is arranged on the bottom of the gate trench in contact with the semiconductor layer 103. The gate stack 870 is disposed on the first spacer 871. The second spacer 872 (top spacer) is disposed on the gate stack 870.

The spacers 871, 872 may include an insulating material, for example, silicon dioxide, silicon nitride, SiOCN, or SiBCN. Other non-limiting examples of materials for the spacers 871, 872 include dielectric oxides (e.g., silicon oxide), dielectric nitrides (e.g., silicon nitride), dielectric oxynitrides, or any combination thereof. The spacer materials are deposited by a deposition process, for example, chemical vapor deposition (CVD) or physical vapor deposition (PVD).

The gate stack 870 (metal gate) may include a gate dielectric material, a work function metal, and a conductive gate metal. The gate dielectric material(s) can be a dielectric material having a dielectric constant greater than 3.9, 7.0, or 10.0. Non-limiting examples of suitable materials for the gate dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and numbers of high-k dielectric materials used.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A gate metal is deposited over the gate dielectric material(s) and work function metals to form the gate stack 870. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

Figure 9:
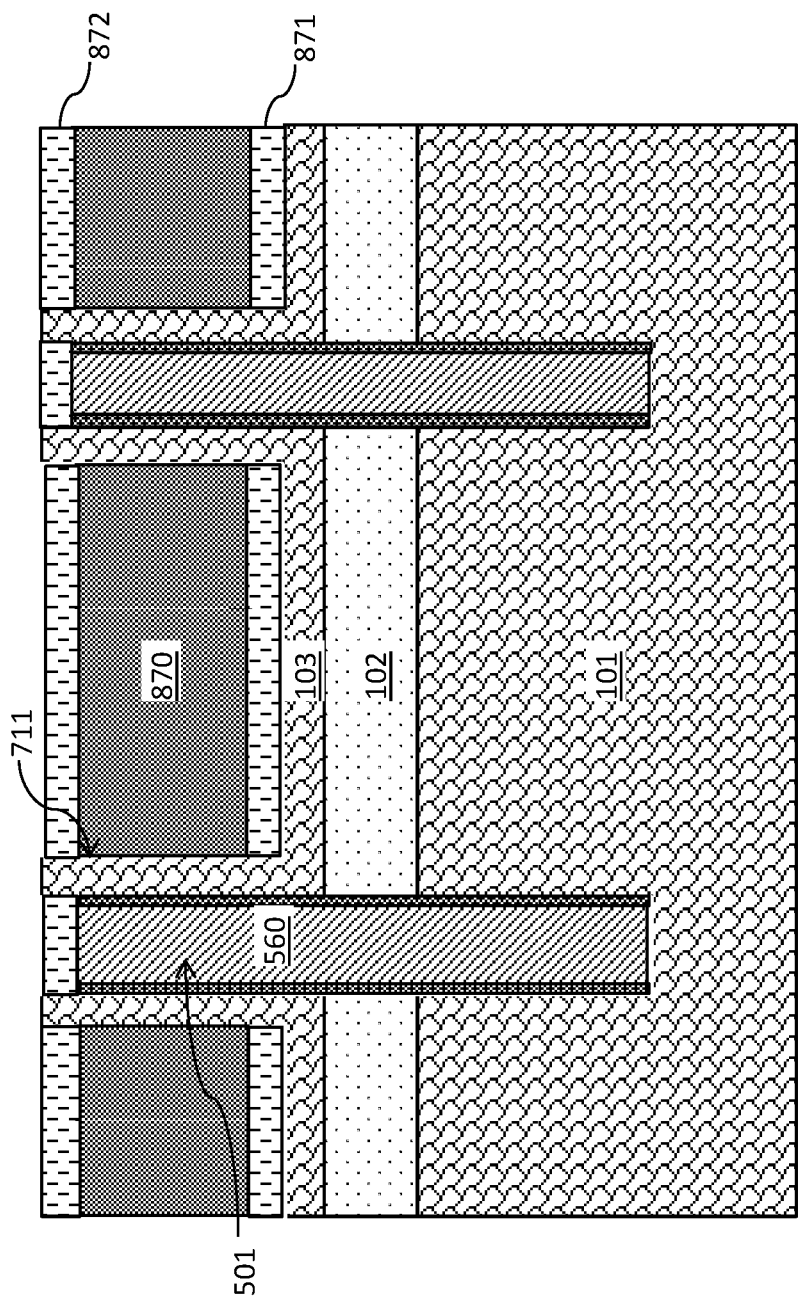

FIG. 9 is a cross-sectional side view after removing remaining portions of the hardmask layer 450. The surface of the vertical channel 711 is exposed. Remaining portions of the hardmask layer 450 may be removed by an etch process, for example, a wet etch process. An example of a wet etch process to etch the hardmask layer 450 may include a hot phosphorus (50 to 200° C.) solution. In another example, an isotropic RIE process may include fluorine-based chemistry.

The substrate contact 501 extends from a region within the bulk semiconductor layer 103, through the buried oxide layer 102, along a sidewall of the vertical channels 711, and to the second spacer 872.

Figure 10:
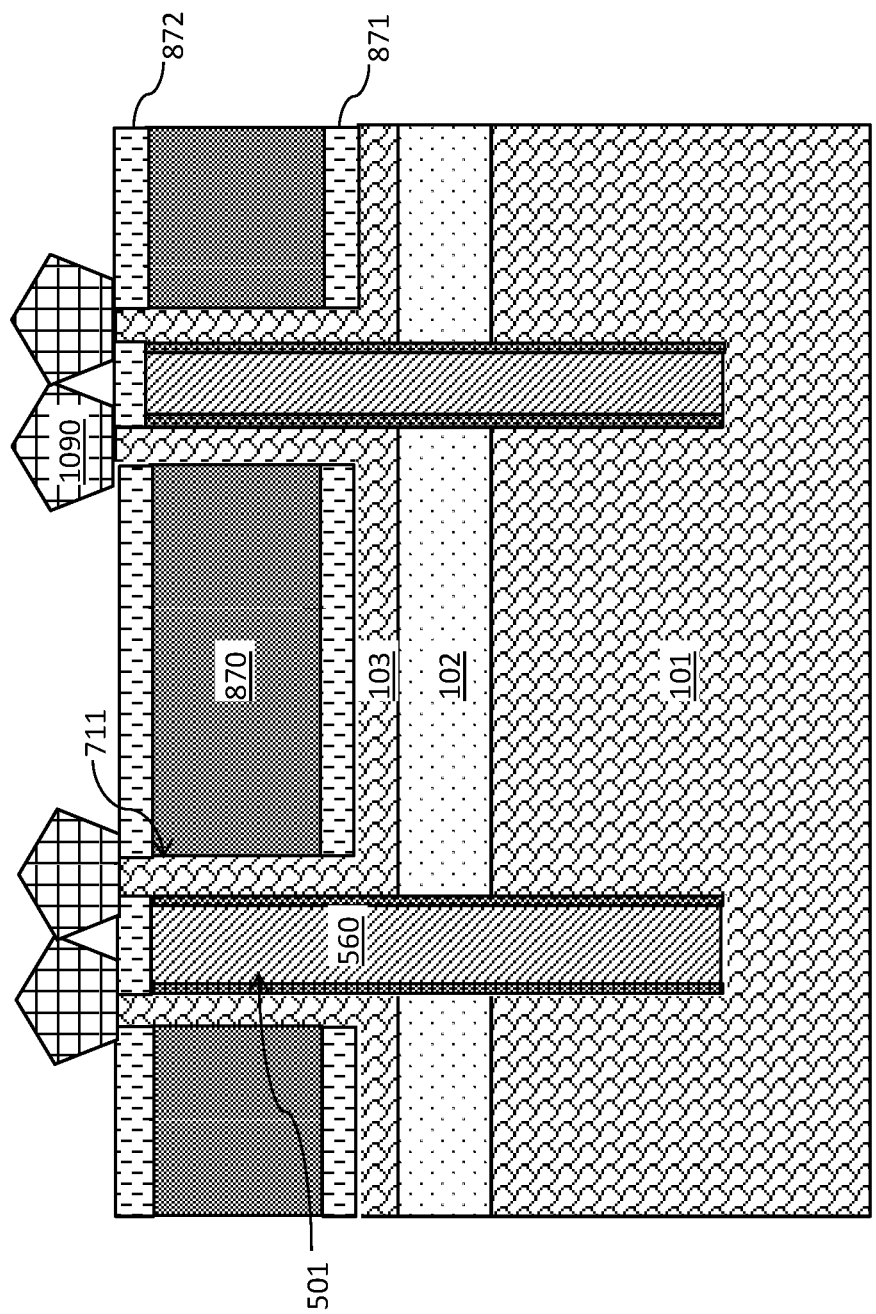

FIG. 10 is a cross-sectional side view after forming epitaxial growth 1090 on the vertical channels 711 to form the top source/drain. The epitaxial growth 1090 includes an epitaxial semiconductor material. The epitaxial growth and/or deposition processes are selective to forming on semiconductor surfaces and do not deposit material on other surfaces, such as the spacer 872.

The epitaxial source/drain be grown using a suitable growth process, for example, chemical vapor deposition (CVD), liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial growth 1090 material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. An epitaxial germanium layer can be deposited from a germanium gas source that is selected from the group consisting of germane, digermane, halogermane, dichlorogermane, trichlorogermane, tetrachlorogermane, and combinations thereof. An epitaxial silicon germanium alloy layer can be formed utilizing a combination of such gas sources. Carrier gases like hydrogen, nitrogen, helium and argon can be used. The epitaxial material may be doped with a dopant, for example, am n-type dopant or a p-type dopant.

The channels 711 extend the portion of the semiconductor layer 103 forming the bottom source/drain to the epitaxial growth forming the top source/drains (first top source/drain and second top source/drain). An epitaxial growth 1090 may be formed on each channel 711, as shown in FIG. 10.

Figure 11:
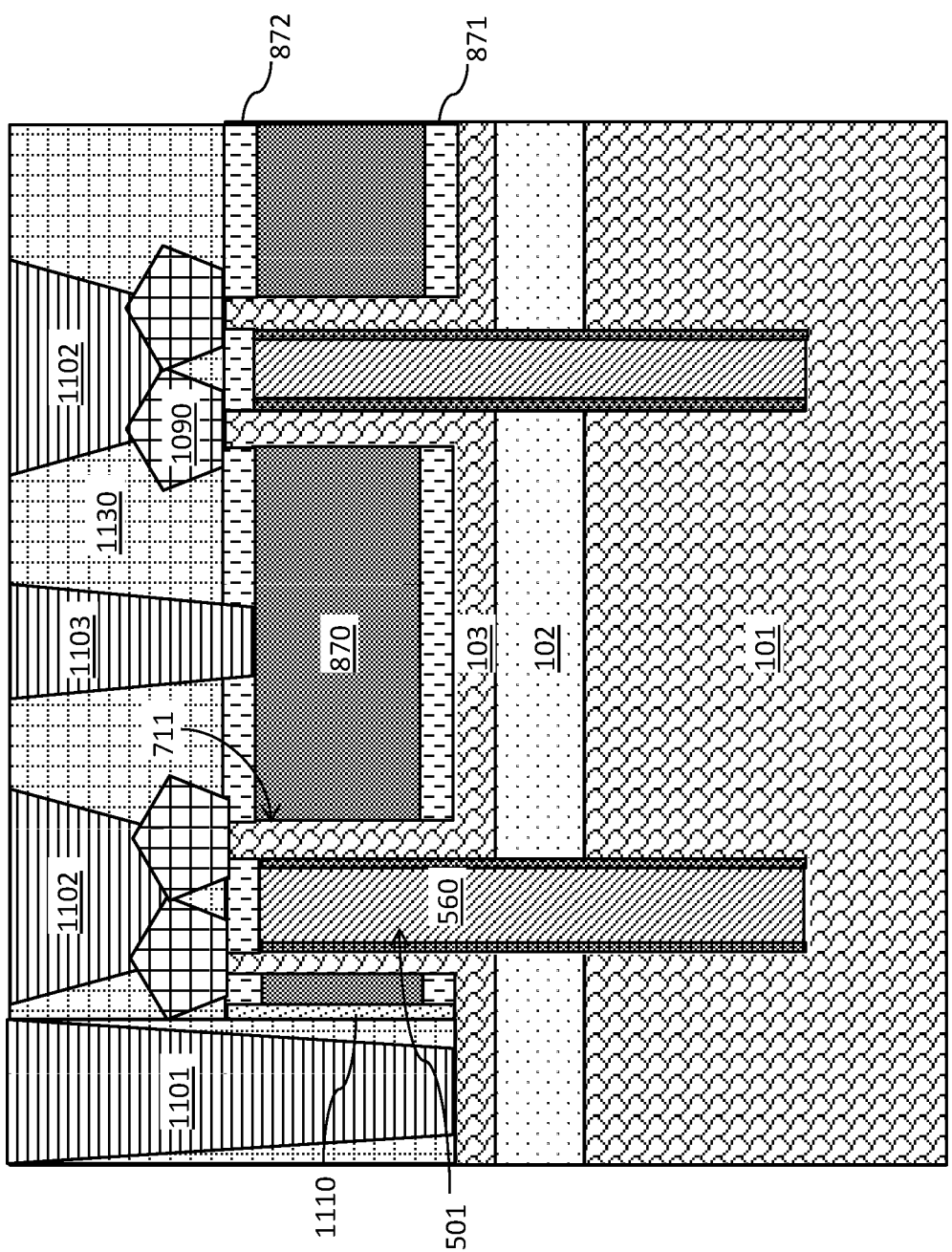

FIG. 11 is a cross-sectional side view after depositing an inter-layer dielectric (ILD) 1130 on the second spacer 872 and forming contacts in the ILD 1130. The ILD 1130 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 1130 is deposited by a deposition process, including, but not limited to CVD, PVD, plasma enhanced CVD, atomic layer deposition (ALD), evaporation, chemical solution deposition, or like processes.

The contacts are formed in the ILD 1130 by etching trenches in the ILD 1130. A bottom source/drain contact 1101 extends through the ILD 1130 to the bottom source/drain region formed in the semiconductor layer 103. A top source/drain contact 1102 extends through the ILD 1130 to the epitaxial growth 1090 forming the top source/drain. A top source/drain contact 1102 may be formed on the two epitaxial growths 1090 arranged on the pair of channels 711. A gate contact 1103 extends through the ILD 1130 to the gate stack 870.

Each of the contacts may be generally formed by removing portions of the ILD 1130 to form trenches. A resist, such as a photoresist, may be deposited and patterned to form the contact trenches. An etch process, such as a RIE, is performed to remove the ILD 1130. The contact trenches are filled with a conductive material or a combination of conductive materials. The conductive material filling may be a conductive metal, for example, aluminum (Al), platinum (Pt), gold (Au), tungsten (W), titanium (Ti), or any combination thereof. The conductive material is deposited by a suitable deposition process, for example, CVD, PECVD, PVD, plating, thermal or e-beam evaporation, or sputtering. A planarization process, for example, CMP, is performed to remove any conductive material from the surface of the ILD 1130.

As described above, various embodiments provide methods of making semiconductor devices with tall and discrete epitaxial source/drain regions over recessed fin structures, which provide several advantages. Conductive contact materials surround the discrete epitaxial source/drain regions to merge the epitaxial source/drain regions and form an all-around fin in the epitaxial source/drain regions. Embodiments of the inventive structure and methods provide reduced contact resistance contact for a device with a tall fin structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for forming a substrate contact comprising:
a sacrificial layer disposed on a hardmask arranged on and in direct contact with a substrate, the substrate comprising a bulk semiconductor layer, a buried oxide layer arranged on the bulk semiconductor layer, and a semiconductor layer arranged on the buried oxide layer;
a trench extending from an opening at a top surface of the sacrificial layer and continuously through the hardmask, semiconductor layer, buried oxide layer, and to a region within the bulk semiconductor layer;
a liner arranged on sidewalls of the trench and directly contacting the hardmask, the bulk semiconductor, the buried oxide layer, and the semiconductor layer; and
oxide spacers arranged on sidewalls of the opening in the sacrificial layer.

2. The structure of claim 1, wherein the liner comprises an oxide material or a nitride material.

3. The structure of claim 1, wherein the liner is not disposed on an endwall of the trench, opposite the opening.

4. The structure of claim 1, wherein the hardmask comprises silicon oxide, silicon nitride, or a combination thereof.

5. The structure of claim 1, wherein a top surface of the conductive material is arranged at a bottom surface of the hardmask.

6. The structure of claim 1 further comprising a conductive material arranged in the trench.

7. The structure of claim 6, wherein the conductive material comprises a metal.

8. The structure of claim 6, wherein the conductive material comprises a doped polysilicon.

9. The structure of claim 6, wherein the conductive material comprises aluminum, platinum, gold, tungsten, titanium, or a combination thereof.

10. A structure for forming a substrate contact comprising:
a sacrificial layer disposed on a hardmask arranged on and in direct contact with a substrate, the substrate comprising a bulk semiconductor layer, a buried oxide layer arranged on the bulk semiconductor layer, and a semiconductor layer arranged on the buried oxide layer;
a trench extending from an opening at a top surface of the sacrificial layer and continuously through the hardmask, semiconductor layer, buried oxide layer, and to a region within the bulk semiconductor layer;
a liner arranged on sidewalls of the trench and directly contacting the hardmask, the bulk semiconductor, the buried oxide layer, and the semiconductor layer; and
oxide spacers arranged on sidewalls of the opening in the sacrificial layer, the oxide spacers being partially recessed with respect to the top surface of the sacrificial layer.

11. The structure of claim 10, wherein the liner comprises an oxide material or a nitride material.

12. The structure of claim 10, wherein the liner is not disposed on an endwall of the trench, opposite the opening.

13. The structure of claim 10, wherein the hardmask comprises silicon oxide, silicon nitride, or a combination thereof.

14. The structure of claim 10, wherein a top surface of the conductive material is arranged at a bottom surface of the hardmask.

15. The structure of claim 10 further comprising a conductive material arranged in the trench.

16. The structure of claim 15, wherein the conductive material comprises a metal.

17. The structure of claim 15, wherein the conductive material comprises a doped polysilicon.

18. The structure of claim 15, wherein the conductive material comprises aluminum, platinum, gold, tungsten, titanium, or a combination thereof.

* * * * *